United States Patent
Liao et al.

(10) Patent No.: US 8,808,560 B2
(45) Date of Patent: Aug. 19, 2014

(54) METHOD FOR PRODUCING SINGLE-CRYSTAL DIAMOND MOVABLE STRUCTURE

(75) Inventors: Meiyong Liao, Tsukuba (JP); Yasuo Koide, Tsukuba (JP); Shunichi Hishida, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 13/579,446
(22) PCT Filed: Feb. 18, 2011
(86) PCT No.: PCT/JP2011/053538
§ 371 (c)(1),
(2), (4) Date: Oct. 22, 2012
(87) PCT Pub. No.: WO2011/102474
PCT Pub. Date: Aug. 25, 2011

(65) Prior Publication Data
US 2013/0043213 A1    Feb. 21, 2013

(30) Foreign Application Priority Data
Feb. 22, 2010  (JP) ................ 2010-035602

(51) Int. Cl.
  *C23F 3/02*   (2006.01)
  *B44C 1/22*   (2006.01)
  *B81C 1/00*   (2006.01)
  *C30B 29/04*  (2006.01)
  *C30B 31/22*  (2006.01)

(52) U.S. Cl.
  CPC ........... *C30B 29/04* (2013.01); *B81C 2201/019* (2013.01); *B81C 1/0015* (2013.01); *C30B 31/22* (2013.01)
  USPC ................ 216/62; 216/81; 205/640

(58) Field of Classification Search
  None
  See application file for complete search history.

(56) References Cited

U.S. PATENT DOCUMENTS 3,895,313 A * 7/1975 Seitz ............... 372/103
5,130,111 A * 7/1992 Pryor ............. 423/446
(Continued)

FOREIGN PATENT DOCUMENTS

| JP | 8-115898 | 5/1996 |
| JP | 8-261853 | 10/1996 |

(Continued)

OTHER PUBLICATIONS

International Search Report issued Apr. 19, 2011 in corresponding International Application No. PCT/JP2011/053538.

*Primary Examiner* — Allan Olsen
(74) *Attorney, Agent, or Firm* — Wenderoth, Lind & Ponack, L.L.P.

(57) ABSTRACT

The utilization of single crystal diamond in a nano- or micro-machine (N/MEMS) device is difficult, and there has been no report on such utilization. The reason for this resides in that it is difficult to grow single crystal diamond on an oxide which is a sacrifice layer. In a conventional technique, a cantilever or the like is produced by forming polycrystalline diamond or nanodiamond on an oxide as a sacrifice layer, but the mechanical performance, vibration characteristics, stability, and reproducibility of the produced cantilever or the like are unsatisfactory. In the present invention, utilizing the fact that the high concentration ion-implanted region in a diamond substrate 101 is modified into graphite, the layer 104 modified into graphite as a sacrifice layer is removed by electrochemical etching to obtain the diamond layer remaining on the resultant substrate as a movable structure. The produced cantilever 106 exhibited high frequency resonance. The use of single crystal diamond makes it possible to improve the N/MEMS device in mechanical performance and stability as well as electric properties.

5 Claims, 8 Drawing Sheets

(56) References Cited

U.S. PATENT DOCUMENTS

| | | | |
|---|---|---|---|
| 5,264,071 A * | 11/1993 | Anthony et al. | 117/3 |
| 5,334,283 A * | 8/1994 | Parikh et al. | 216/81 |
| 5,500,077 A * | 3/1996 | Nishibayashi et al. | 216/38 |
| 5,614,019 A * | 3/1997 | Vichr et al. | 117/84 |
| 5,792,254 A * | 8/1998 | Windischmann | 117/88 |
| 6,422,077 B1 | 7/2002 | Krauss et al. | |
| 6,811,612 B2 * | 11/2004 | Gruen et al. | 117/94 |
| 2005/0181210 A1 | 8/2005 | Doering et al. | |
| 2006/0172515 A1 * | 8/2006 | Olivero et al. | 438/515 |
| 2009/0050824 A1 * | 2/2009 | Huntington et al. | 250/492.3 |

FOREIGN PATENT DOCUMENTS

| | | |
|---|---|---|
| JP | 2008-526682 | 7/2008 |
| WO | 2010/016257 | 2/2010 |

* cited by examiner

METHOD FOR PRODUCING SINGLE-CRYSTAL DIAMOND MOVABLE STRUCTURE

TECHNICAL FIELD

The present invention relates to a nano- or micro-electromechanical system device or the like, and more particularly to a method for producing a single-crystal diamond movable structure usable as an element for the device.

BACKGROUND ART

Diamond is an ultimate material having extremely excellent mechanical, electrical, thermal, chemical, and optical properties. A nano- or micro-electromechanical system (N/MEMS) device is improved in the performance by utilizing these properties of diamond, and can be applied to mass (biological or chemical) sensors having high mechanical, chemical, and thermal stability and extremely high sensitivity, ultrahigh speed imaging measurement at an atomic level, or the like. For forming the diamond N/MEMS, the production of a movable structure, i.e., a three-dimensional structure having a movable part separated from a substrate, such as a cantilever or a bridge, is indispensable. A movable structure is produced by a conventional technique in which a patterned oxide thin film (for example, $SiO_2$) is deposited as a sacrifice layer on a semiconductor substrate made of silicon or the like, and on the sacrifice layer is selectively grown polycrystalline or nanoparticle crystalline diamond or diamond like carbon, followed by removal of the sacrifice layer by etching. With respect to the conventional technique, reference can be made to patent documents 1 and 2.

PRIOR ART DOCUMENTS

Patent Documents

PATENT DOCUMENT 1: JP-A-8-115898 "Diamond bridge or diamond cantilever and method for producing the same, and electronic device using the diamond bridge or diamond cantilever"

PATENT DOCUMENT 2: U.S. Pat. No. 6,422,077 'Ultrananocrystalline diamond cantilever wide dynamic range acceleration/vibration/pressure sensor', A. R. Krauss, D. M. Gruen, M. J. Pelline, O. Auciello.

SUMMARY OF THE INVENTION

Problems that the Invention is to Solve

It is an object of the present invention to solve the above-mentioned prior-art problems and to provide a method for producing a movable structure comprising single crystal diamond.

Means for Solving the Problems

In an aspect of the invention, there is provided a method for producing a single-crystal diamond movable structure, which comprises the following steps (a) to (d):
(a) modifying a part of a single-crystal diamond substrate into a graphite layer,
(b) growing a single-crystal diamond layer on the single-crystal diamond substrate,
(c) etching the single-crystal diamond layer into a predetermined shape, and
(d) removing the graphite layer to form an air gap between the single-crystal diamond layer and the single-crystal diamond substrate.

The modification into a graphite layer may be performed by ion implantation.

The removal of the graphite layer may be performed by electrochemical etching.

Effect of the Invention

In the invention, a movable structure, such as a cantilever, can be produced from single crystal diamond having excellent properties, as compared to polycrystalline diamond, thus making it possible to improve the performance of a diamond N/MEMS.

DETAILED DESCRIPTION OF THE INVENTION

In view of the above background, in the invention, utilizing the fact that the high concentration ion-implanted region in diamond is modified into graphite, the layer modified into graphite as a sacrifice layer is removed by etching to form a movable structure. In an embodiment, a cantilever according to the invention was produced as an N/MEMS device, and resonance of the cantilever was demonstrated. Further, in another embodiment, a bridge structure was also produced as an N/MEMS device using the process of the invention. The important points of the formation of the cantilever and bridge are that the single crystal diamond in the region which is not ion-implanted serves as a support for the N/MEMS movable structure and that the movable structure is formed by etching the sacrifice layer. By utilizing the thus produced single-crystal diamond cantilever of the invention, excellent mechanical performance and high vibration frequency as well as high reliability and reproducibility can be realized. In the embodiments, a cantilever and a bridge having a width of 10 μm and a length of 20 to 90 μm are produced, but, by using a nanofabrication technique, a cantilever and a bridge on a scale of nanometer having a width of about 10 to 100 nm and a length of about 100 nm can be produced. That is, in the invention, a cantilever and a bridge on a scale of micrometer or nanometer having a width of about 10 nm to 100 μm and a length of about 100 nm to 1,000 μm can be produced. A resonance frequency is proportional to a product of the scale and a Young's modulus, and therefore, when a cantilever and a bridge on a scale of nanometer using a hard diamond single crystal having a large Young's modulus can be produced, it is possible to achieve high frequency resonance in the gigahertz (GHz) region.

EMBODIMENTS

Figure 1:
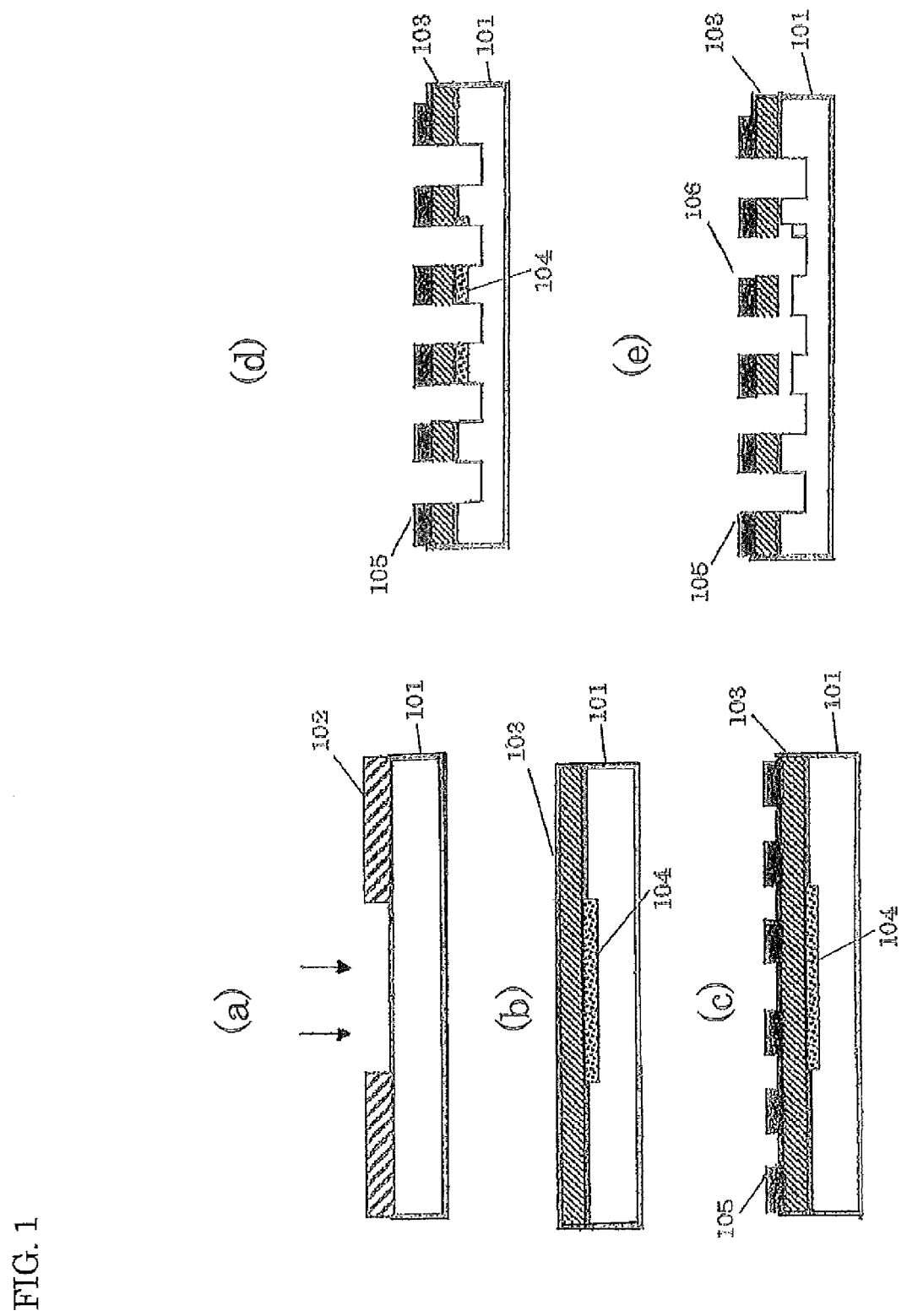
FIG. 1 is diagrammatic views showing a series of processes in the method for producing a single-crystal diamond cantilever, wherein (a) shows selective high-energy ion implantation, (b) shows MPCVD growth for a diamond epitaxial layer, (c) shows patterning for a WC/Au thin film, (d) shows dry etching for the diamond, and (e) shows electrochemical etching for the graphite sacrifice layer.

FIG. 1 shows diagrammatic views of a series of processes for producing a diamond cantilever according to an embodiment of the invention. In this figure, (a) shows a selective high-energy ion implantation process, (b) shows an MPCVD growth process for a diamond epitaxial layer, (c) shows a patterning process for WC/Au, (d) shows a dry etching process for the diamond, and (e) shows an electrochemical etching process for the ion-implanted region. In these processes, a beam-form structure (cantilever) supported at one end thereof and a bridge-form structure (bridge) supported at both ends thereof, each comprising a diamond epitaxial layer/WC/Au, were formed on a diamond single crystal. Hereinbelow, the processes are described in more detail with reference to FIG. 1.

1. A Graphite Sacrifice Layer is Formed Under the Surface of Diamond.

Using a molybdenum plate 102 having a patterned perforated structure as a mask, the (100) plane surface of a single-crystal diamond substrate 101 synthesized by a high-temperature high-pressure synthesis method was subjected to selective ion implantation (FIG. 1(a)). Conditions for the ion implantation were as follows.

Ion species: $B^+$, $C^+$, $He^+$
Ion energy: 180 keV-1 MeV
Beam current: 180 to 500 nA/cm$^2$
Angle of implantation: 7 Degrees
Implanted amount: $10^{16}$ N/cm$^2$ As a result of the ion implantation, a region modified into graphite, which region is designated by numeral 104 in FIG. 1(b), is formed in the ion-implanted region. The ion elemental concentration distribution from the surface of the substrate in the depth direction is known to be a Gaussian distribution, and the depth peak is called a range and estimated at 0.5 to 1 μm. That is, it is considered that the region of the substrate in a depth of 0.5 to 1 μm from the surface is modified into a graphite layer.

In the subsequent process, the surface of the substrate 101 was cleaned, preparatory to growing a diamond epitaxial layer 103 shown in FIG. 1(b) on the substrate 101, by treating the ion-implanted, high-temperature high-pressure synthesized single-crystal diamond substrate 101 in a boiling mixed solution of nitric acid and hydrofluoric acid for 2 to 3 hours.

2. A Diamond Epitaxial Layer is Formed.

A diamond epitaxial layer 103 was grown by a microwave plasma chemical vapor deposition (MPCVD) method. Conditions for the growth were as follows.

Growth technique: Microwave plasma chemical vapor deposition (MPCVD) method
Substrate: Ib type insulating diamond substrate of (100) plane orientation
Source gas: Methane ($CH_4$); Flow rate: 0.4 sccm
Carrier (diluent) gas: Hydrogen ($H_2$); Flow rate: 500 sccm
$CH_4/H_2$ Ratio: 0.08%
Pressure during growth: 80 Torr
Microwave power: 400 W
Substrate temperature: 960° C.
Growth time: 8 Hours
Thickness of the epitaxial layer: 0.3 μm After the growth, the feeding of methane gas was stopped. Then, the diamond epitaxial layer 103 was maintained at the temperature of the substrate in a hydrogen gas atmosphere for 10 minutes. The concentration of boron in the diamond epitaxial layer 103 was $10^{16}$ cm$^{-3}$. The surface of the diamond layer 103 was in a state of being hydrogen terminated. This process is a standard process for growing the diamond epitaxial layer 103. After the growth of the diamond epitaxial layer 103, for removing the surface conduction layer to obtain an oxygen terminated surface, the epitaxial substrate was treated in a mixed solution of sulfuric acid and nitric acid at 250° C. for 30 minutes.

3. A Single-Crystal Diamond Cantilever is Produced.

On the diamond epitaxial layer 103 grown on the ion-implanted single-crystal diamond substrate 101, as shown in FIG. 1(c), a tungsten carbide/gold (WC/Au, wherein "/" indicates the order of deposition) layer 105 was formed so that WC and Au were individually deposited at 30 nm, followed by patterning by a lift-off method. Using the WC/Au layer 105 as a mask and using a mixed gas plasma of oxygen and argon, the diamond was subjected to dry etching. Conditions for the etching were as follows.

$Ar/O_2$ Ratio: 1:1
Gas flow rate: 10 sccm for each of Ar and $O_2$
Microwave power: 100 W
Etching time: 1 Hour In the dry etching conducted under the above-shown conditions, the etching rate for the diamond was 20 nm/min. The result of the dry etching is shown in FIG. 1(d).

Finally, for removing the layer modified into graphite in the ion-implanted region, i.e., the region 104 modified into graphite, the diamond sample was subjected to electrochemical etching in pure water. Conditions for the etching were such that the applied voltage was 150 V and the current was about 25 mA. The result in which the region 104 modified into graphite was removed by electrochemical etching is shown in FIG. 1(e).

By the above-mentioned series of processes, a cantilever (movable structure) 106 having an air gap between the diamond epitaxial layer 103 and the single-crystal diamond substrate 101 was produced.

4. Evaluation of the Experimental Results

Figure 2:
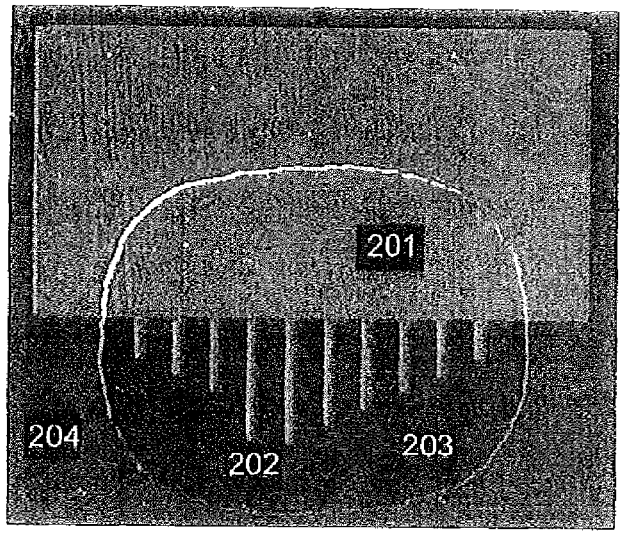
FIG. 2 shows an optical microscope image of the diamond sample obtained after the process (c) shown in FIG. 1.

FIG. 2 shows an optical microscope image of the diamond sample obtained after the process (c) shown in FIG. 1. A dark portion designated by numeral 203 indicates an ion-implanted region (region modified into graphite), and a relatively dark portion designated by numeral 204 indicates a region which is not ion-implanted (non-ion-implanted region). A light portion designated by numeral 201 indicates a WC/Au film, and a beam-form portion designated by numeral 202 indicates a region to finally constitute a cantilever.

Figure 3:
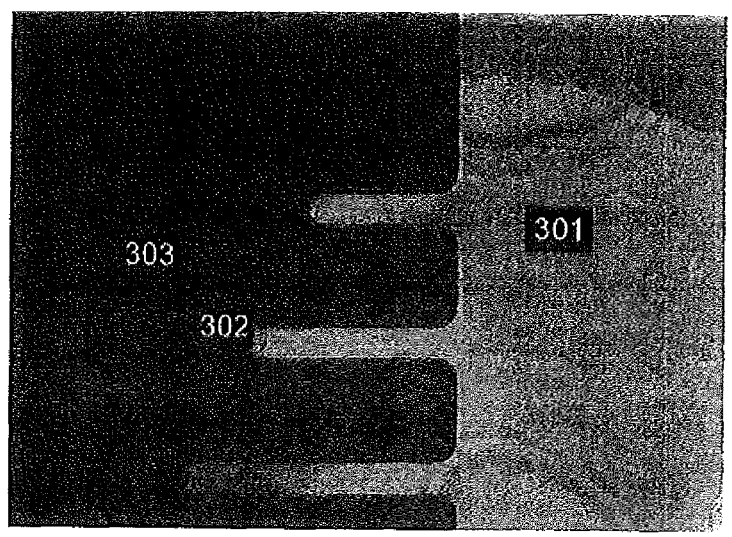
FIG. 3 shows an optical microscope image of the diamond cantilever finally produced after the processes of FIG. 1.

FIG. 3 shows an optical microscope image of the diamond cantilever finally produced after the processes of FIG. 1. A dark portion designated by numeral 303 indicates the diamond single crystal substrate dry-etched in a depth of 1.2 μm. A light portion designated by numeral 301 indicates a WC/Au film, and a beam-form portion designated by numeral 302 indicates a cantilever comprising a diamond epitaxial layer/WC/Au. From FIG. 3, it is found that diamond cantilevers having different lengths are produced.

Figure 4:
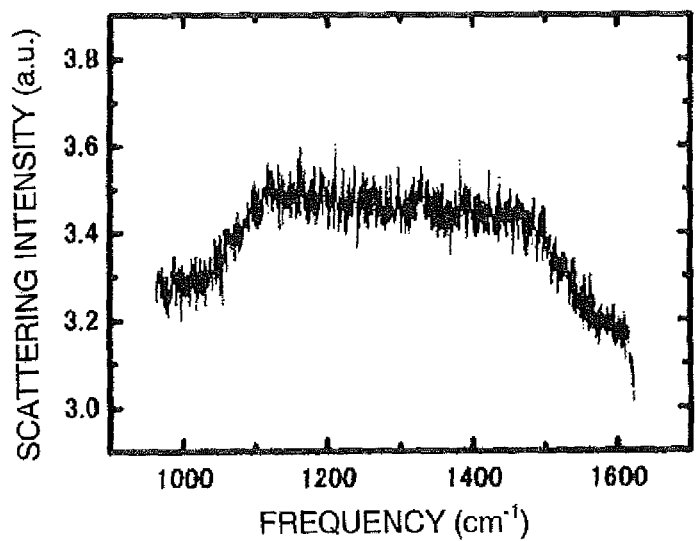
FIG. 4 is a diagram showing a Raman scattering spectrum measured with respect to the epitaxial layer grown on the portion of single crystal diamond which is ion-implanted.

FIG. 4 shows a Raman scattering spectrum measured with respect to the diamond layer grown on the ion-implanted region of single crystal diamond, i.e., the ion-implanted region 203 shown in FIG. 2. In this figure, a peak appearing at 1,332 cm$^{-1}$ corresponding to the sp$^3$ bond of diamond is not observed, and a broad scattering signal at from 1,100 to 1,500 cm$^{-1}$ is observed. This result shows that the single-crystal diamond substrate in the ion-implanted region has suffered damage due to ions and has been modified into graphite. From the result that a peak appearing at 1,332 cm$^{-1}$ corresponding to the sp$^3$ bond of diamond ascribed to the diamond thin film layer grown in this region is not observed, it is considered that the depth of the region of the layer modified into graphite is satisfactorily large, as compared to the diamond thin film (0.3 μm) grown in this region.

Figure 5:
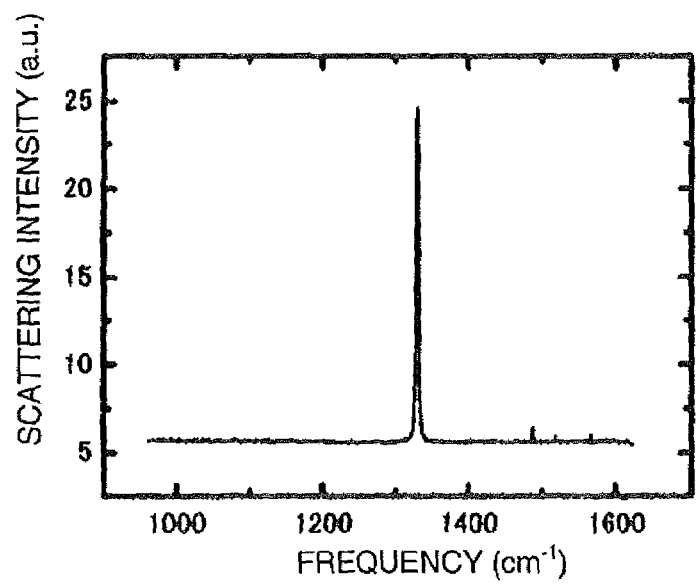
FIG. 5 is a diagram showing a Raman scattering spectrum measured with respect to the epitaxial layer grown on the portion of single crystal diamond which is not ion-implanted.

FIG. 5 shows a Raman scattering spectrum measured with respect to the diamond epitaxial layer grown on the non-ion-implanted region of single crystal diamond, i.e., the non-ion-implanted region 204 shown in FIG. 2. In this figure, a peak appearing at 1,332 cm$^{-1}$ corresponding to the sp$^3$ bond of diamond is observed, and, from this, it is found that a graphite layer is not formed in this region.

Figure 6:
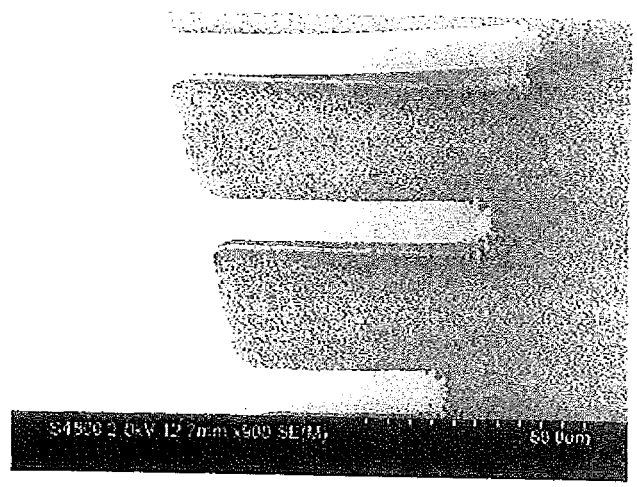
FIG. 6 shows a scanning electron microscope image of the produced single-crystal diamond cantilever.

FIG. 6 shows an example of a scanning electron microscope image of the single-crystal diamond cantilever. In this figure, an air gap formed between the diamond substrate 101 and the cantilever 106 is clearly observed. The reason why the cantilever 106 looks like having a double layer structure in this figure resides in that the etching depth of 1.2 μm causes the sidewall of the etched portion of the diamond substrate to be seen. The lengths of the cantilevers 106 are respectively 50, 70, and 90 μm in ascending order.

Figure 7:
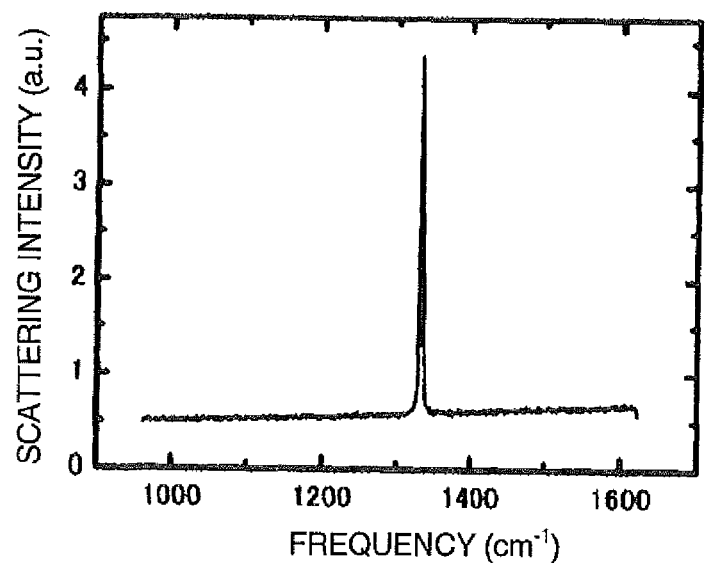
FIG. 7 is a diagram showing a Raman spectrum of the single-crystal diamond cantilever.

FIG. 7 shows a Raman scattering spectrum of the single-crystal diamond cantilever portion, which corresponds to the region designated by numeral 302 in FIG. 3. The graphite sacrifice layer, i.e., the region 104 modified into graphite in FIG. 1 is removed, and therefore only a peak of the sp$^3$ bond of diamond can be observed. Thus, the results have demonstrated that a cantilever comprising a diamond single crystal has been produced.

Figure 8:
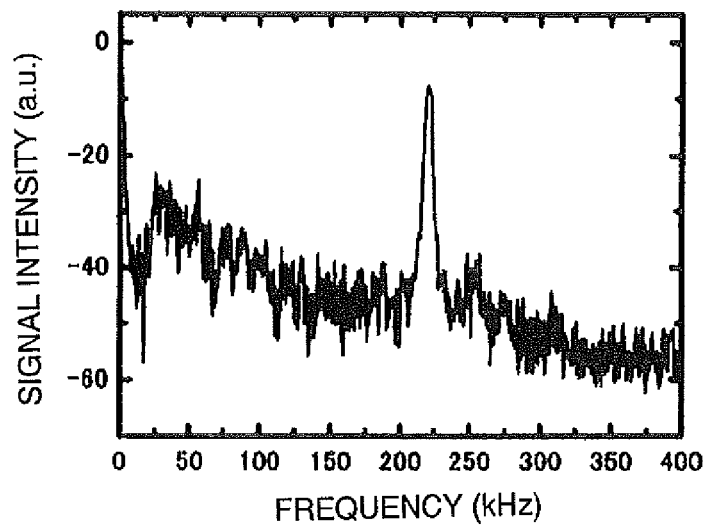
FIG. 8 is a diagram showing a vibration frequency spectrum of the single-crystal diamond cantilever having a length of 50 μm.

FIG. 8 shows an example of a vibration frequency spectrum of the single-crystal diamond cantilever having a length of 50 μm. The measurement of the vibration frequency spectrum was performed by placing the produced diamond cantilever on a piezoelectric element and driving the piezoelectric element by applying a voltage to measure a resonance frequency using a spectrum analyzer. From this vibration frequency spectrum, a resonance frequency is found to be 220 kHz. The results have confirmed that a cantilever is produced in a diamond single crystal by the process of the invention and that a resonance phenomenon occurs in the produced cantilever.

Figure 9:
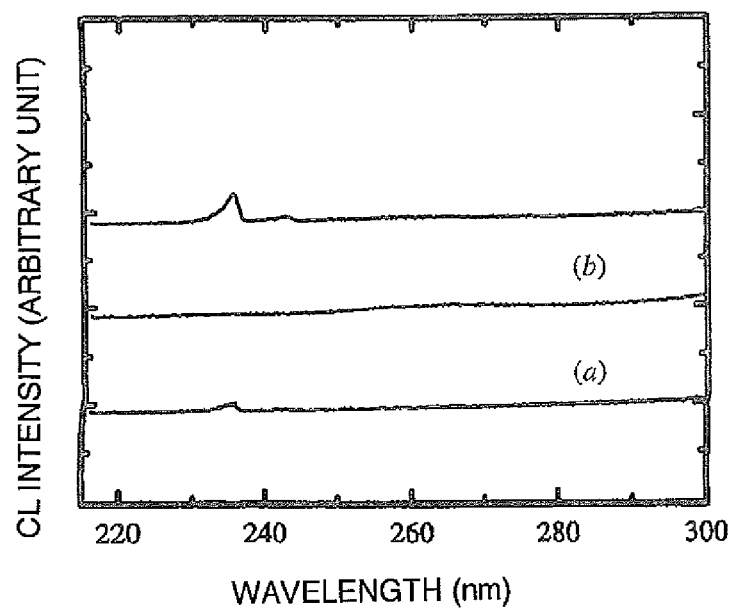
FIG. 9 is a diagram showing data of a cathode luminescence spectrum.

FIG. 9 shows data of a cathode luminescence spectrum as measured by an SEM at an accelerating voltage of 20 kV. In FIG. 9, (a) shows data for single crystal diamond, (b) shows data for the epitaxial layer grown on the ion-implanted portion of single crystal diamond, and (c) shows data for the single-crystal diamond cantilever. Also from the data of FIG. 9(c) in which an excitation peak appearing at 235 nm is observed, it is found that the single-crystal diamond cantilever is of high quality.

Figure 10:
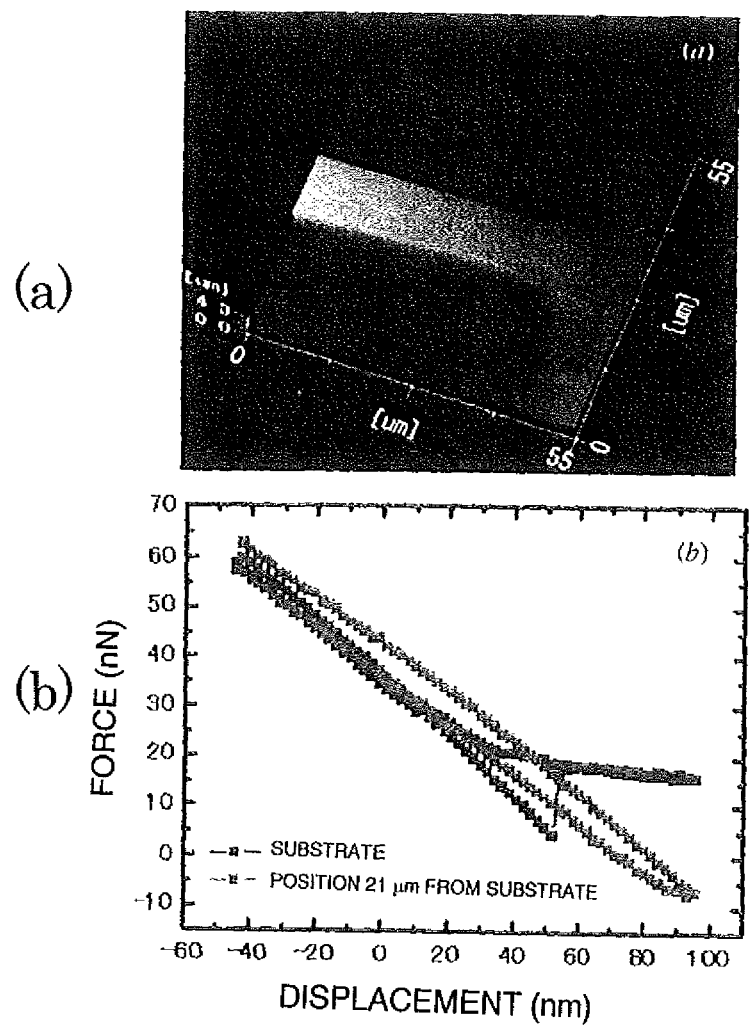
FIG. 10 is diagrams showing the results of nanoindentation using an atomic force microscope (AFM), wherein (a) shows an AFM microscope image of the single-crystal diamond cantilever, and (b) shows a force-displacement curve.

For examining the single-crystal diamond cantilever in respect of the mechanical bending properties, nanoindentation using an atomic force microscope (AFM) (JEOL JSPM-5200 scanning probe) was performed. In FIG. 10, (a) shows an AFM image of the single-crystal diamond cantilever, and (b) shows a force-displacement curve measured with respect to the position 21 μm from the substrate. From this figure, it is found that the single-crystal diamond cantilever reversibly displaces and exhibits substantially an elastic behavior.

Further, a Young's modulus of the single-crystal diamond cantilever was determined, and, as a result, the Young's modulus was found to be 800±200 GPa.

Hereinabove, the specific embodiment of the present invention was described in detail. However, needless to say, the invention is not limited to the above-mentioned constructions, and it should be noted that the invention can be modified into various forms including the examples shown below.

In the above embodiment, the single-crystal diamond cantilever is produced using a general photolithography process, but can be produced using electron beam lithography or laser lithography.

Further, in the above embodiment, a cantilever is produced as an example of the movable structure, but the movable structure can be in the form of being supported at two or more portions, for example, in the form of a beam supported at both ends, or in the form of a line or a rod, or in a more general planar form, and can be in other arbitrary forms as long as it is in a form such that an object one-dimensionally or two-dimensionally overhangs in an arbitrary direction from the base fixed to the substrate.

Figure 11:
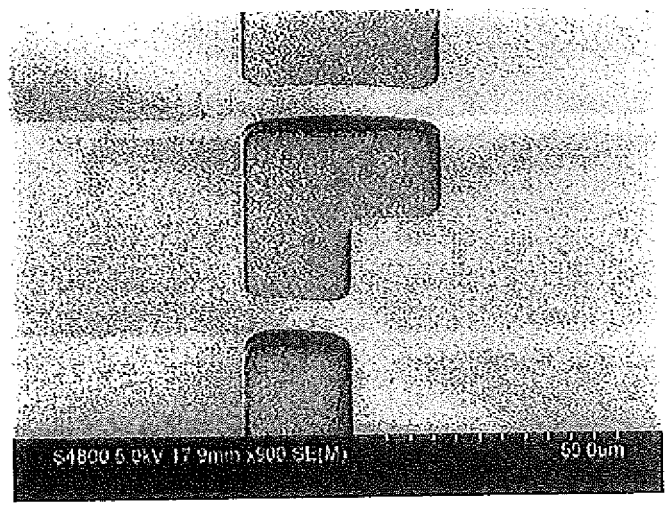
FIG. 11 shows a scanning electron microscope image of the produced single-crystal diamond bridge.
Figure 12:
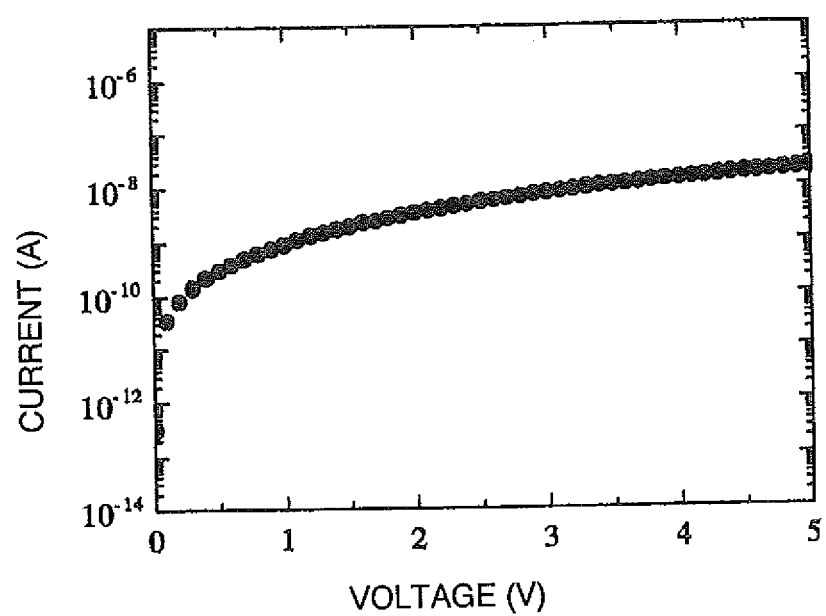
FIG. 12 is a diagram showing current-voltage (I-V) characteristics of the single-crystal diamond bridge structure.

FIG. 11 shows an example of a single-crystal diamond bridge structure supported at both ends, which is produced by the same production process as mentioned above. This single-crystal diamond bridge structure had a width of 5 μm and a length of 200 μm, and current-voltage (I-V) characteristics of the single-crystal diamond bridge structure were measured by a two-terminal method. FIG. 12 shows the result of the measurement of I-V characteristics of the single-crystal diamond bridge structure. From this data, it has been found that the single-crystal diamond bridge structure has a resistivity of about 100 Ωm.

Figure 13:
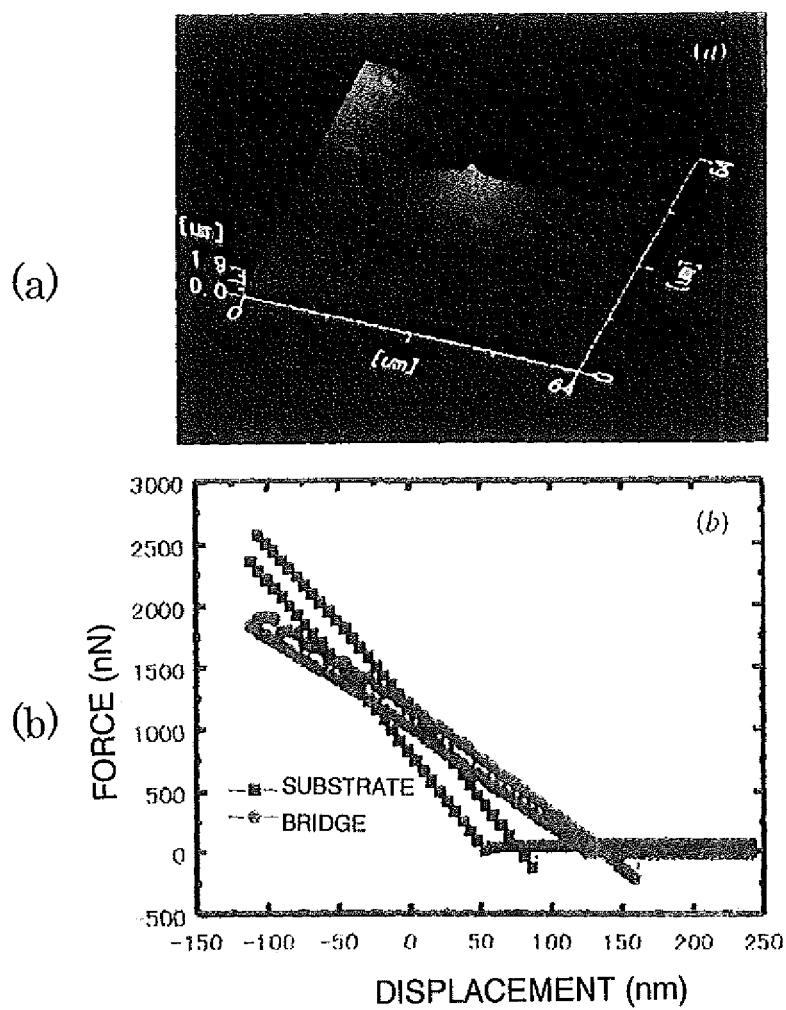
FIG. 13 is diagrams showing the results of nanoindentation using an atomic force microscope (AFM), wherein (a) shows an AFM microscope image of the single-crystal diamond bridge structure, and (b) shows a force-displacement curve.

Further, using the separately produced single-crystal diamond bridge structure (width: 15 μm, length: 40 μm), the same nanoindentation using an AFM as mentioned above in connection with FIG. 10 was performed. In FIG. 13, (a) shows an AFM image of the single-crystal diamond bridge structure, and (b) shows a force-displacement curve measured with respect to the center position of the single-crystal diamond bridge structure. From this figure, it is found that the single-crystal diamond bridge structure reversibly displaces and exhibits substantially an elastic behavior.

Further, a Young's modulus of the single-crystal diamond cantilever was determined, and, as a result, the Young's modulus was found to be 800±200 GPa.

In the above embodiment, boron is added to the diamond epitaxial layer, but the dopant for the epitaxial layer is arbitrary. For example, argon (Ar$^+$) or oxygen (O$^+$) can be used.

Further, in the above embodiment, the single crystal diamond of Ib type containing nitrogen is used, but another single crystal substrate, for example, IIa type diamond single crystal may be used.

With respect to the orientation of the diamond single crystal, the (100) plane is used in the above embodiment, but another arbitrary plane, for example, a (111) or (110) plane may be used.

Further, the thickness of the overhanging portion of the single-crystal diamond cantilever or the like can be changed by controlling the time for the microwave plasma vapor deposition.

INDUSTRIAL APPLICABILITY

As described above in detail, in the present invention, a structure which cannot conventionally be employed in an N/MEMS device can be produced using a diamond single crystal in the N/MEMS device, and the structure can be widely used in the field of the device.

DESCRIPTION OF REFERENCE NUMERALS

101: Single-crystal diamond substrate
102: Molybdenum mask
103: Diamond epitaxial layer
104: Region modified into graphite
105: WC/Au Mask
106: Cantilever (Movable structure)
201: Region covered with WC/Au
202: Pattern of the region to constitute a cantilever
203: Ion-implanted region
204: Non-ion-implanted region
301: Region covered with WC/Au
302: Pattern of cantilever
303: Single-crystal diamond substrate etched in a depth of 1.2 μm

The invention claimed is:

1. A method for producing a single-crystal diamond movable structure, said method comprising:

modifying a part of a single-crystal diamond substrate into a graphite layer by an ion implantation using ion species including boron with a first mask having a predetermined opening;

growing a single-crystal diamond epitaxial layer on the single-crystal diamond substrate;

forming a second mask having a predetermined shape on the single-crystal diamond epitaxial layer;

dry etching the single-crystal diamond epitaxial layer and the single-crystal diamond substrate; and removing the graphite layer by electrochemical etching to form an air gap between the single-crystal diamond epitaxial layer and the single-crystal diamond substrate so as to form the single-crystal diamond movable structure such that the single-crystal diamond movable structure has electrical conductivity.

2. The method for producing a single-crystal diamond movable structure according to claim 1, wherein the single-crystal epitaxial layer is formed into a beam, only one end of which is bonded with the single-crystal diamond substrate.

3. The method for producing a single-crystal diamond movable structure according to claim 1, wherein the single-crystal epitaxial layer is formed into a beam, both ends of which are bonded with the single-crystal diamond substrate.

4. The method for producing a single-crystal diamond movable structure according to claim 1, wherein the single-crystal diamond epitaxial layer is grown by a microwave plasma chemical vapor deposition (MPCVD).

5. The method for producing a single-crystal diamond movable structure according to claim 1, wherein the second mask is formed in a predetermined shape by depositing WC and Au sequentially, followed by patterning by a lift-off method.

* * * * *